US006274295B1

(12) United States Patent
Dammel et al.

(10) Patent No.: US 6,274,295 B1
(45) Date of Patent: *Aug. 14, 2001

(54) LIGHT-ABSORBING ANTIREFLECTIVE LAYERS WITH IMPROVED PERFORMANCE DUE TO REFRACTIVE INDEX OPTIMIZATION

(75) Inventors: Ralph R. Dammel, Flemington; Robert A. Norwood, Cranford, both of NJ (US)

(73) Assignee: Clariant Finance (BVI) Limited (VG)

( * ) Notice: Subject to any disclaimer, the term of this patent is extended or adjusted under 35 U.S.C. 154(b) by 0 days.

This patent is subject to a terminal disclaimer.

(21) Appl. No.: 09/264,616

(22) Filed: Mar. 8, 1999

Related U.S. Application Data (63) Continuation-in-part of application No. 08/811,807, filed on Mar. 6, 1997, now abandoned.

(51) Int. Cl.$^7$ ....................................................... G03F 7/00
(52) U.S. Cl. ........................... 430/322; 430/325; 430/950
(58) Field of Search .................................. 430/322, 290, 430/311, 950, 325

(56) References Cited

U.S. PATENT DOCUMENTS

| 5,472,827 | 12/1995 | Ogawa et al. ........................ 430/315 |
| 5,554,489 | 9/1996 | Ishibashi et al. .................... 430/326 |
| 6,042,992 | * 3/2000 | Dammel et al. .................... 430/290 |

FOREIGN PATENT DOCUMENTS

| 4311761 | 10/1993 | (DE) . |
| 522990 | 1/1993 | (EP) . |
| 583205 | 2/1994 | (EP) . |
| 7-153682 | 6/1995 | (JP) . |

OTHER PUBLICATIONS

Patent Abstracts of Japan, vol. 96, #5, Mar. 31, 1996, & JP 08 017711, Sony Corp., Jan. 19, 1996.
Patent Abstracts of Japan, vol. 12, #489(E–696), Dec. 21, 1988, & JP 63 202915, Oki Electric Ind. Co. Ltd., Aug. 22, 1988.
Patent Abstracts of Japan, vol. 7, #136(E–181), Jun. 14, 1983, & JP 58 051515, Fujitsu KK, Mar. 26, 1983.
SPIE vol. 1927, Optical/Laser Microlithography, Mar. 3, 1993, pp. 275–286, "Optimization of Anti–reflection Layers for Deep UV Lithography", H. J. Dijkstra et al.
SPIE vol. 2724, Advances in Resist Technology and Processing XIII, Mar. 11, 1996, pp. 754–769, "Modeling of Bottom Anti–reflective Layers: Sensitivity to Optical Constants Photolithography", R. R. Dammel et al.
1046 Journal of the Electrochemical Society 137 (1990) Dec., No. 12, "A New Photolithography Technique with Antireflective Coating on Resist: ARCOR", T. Tanaka et al.
SPIE vol. 1674 Optical/Laser Microlithography V (1992), pp. 147–156, "Reduction of Linewidth Variation Reflective Topography", S.S. Miura et al.
8226 Microelectronic Engineering 25 (1994) May, No. 1, pp. 21–34, "On the Processing of i–line position resists with a top anti–reflective coating", Alexander et al.
SPIE vol. 1466, Advances in Resist Technology and Processing VIII (1991) pp. 297–307, T. Brunner.
Derwent Abstract, JP 7153682 06/95.
Derwent Abstract, JP 7333855 12/95.
JP 7333855–A, Mitsubishi Chem Corp 94.06.10 94JP–128916.

* cited by examiner

*Primary Examiner*—Kathleen Duda
(74) *Attorney, Agent, or Firm*—Sangya Jain (57) ABSTRACT

The invention consists of a light absorbing top antireflective layer that reduces the swing curve amplitude for photoresist materials used in the semiconductor industry. The coating may be water based but is not necessarily so. The advantage of a water-based coating is its ease of use, since it can be applied without intermixing to the softbaked photoresist, and is removed in the development step, so that process complexity is only minimally increased. One problem that has been associated with the existing non-absorbing antireflective coatings is that the optimum swing curve reduction is only achieved at a very low refractive index. The advantages of a dyed coating are a) that the refractive index of the top coat can additionally be lowered by making use of anomalous dispersion effects if the dye is chosen judiciously, and b) that it is possible to achieve the optimum swing curve reduction at a higher refractive index of the top coat. By a combination of these two effects, the present invention demonstrates a reduction of the swing curve close to the theoretical minimum value, which constitutes a substantial improvement over existing antireflective topcoats.

14 Claims, 6 Drawing Sheets

LIGHT-ABSORBING ANTIREFLECTIVE LAYERS WITH IMPROVED PERFORMANCE DUE TO REFRACTIVE INDEX OPTIMIZATION

This application is a continuation-in-part of application Ser. No. 08/811,807 filed on Mar. 6. 1997 now abandon.

BACKGROUND OF THE INVENTION

One of the problems encountered in practical semiconductor device manufacture is the dependence of the imaging dose of the photoresist on the photoresist thickness. If photoresist films below about 4 $\mu$m (micrometers) thickness are used, as they are in the most common applications for high resolution devices, thin film interference effects lead to periodic behavior of the photoresist sensitivity, the "swing curve". Photoresist sensitivity can vary dramatically over a small change in film thickness. On a substrate with topography, this limits the accuracy to which photoresist features can be imaged, and it also reduces the apparent depth of focus. Moving from g-line to i-line and eventually DUV radiation brings with it a large increase of the substrate reflectivity, leading to an increase in the magnitude of the problem.

The classic solution to the above problem has been the use of dyed photoresist materials. Dyed photoresists add a non-bleachable absorption to the photoresist (i.e., they increase the Dill B parameter). This reduces the swing curve by causing increased attenuation of the light in the photoresist, even when the photoresist is near to full exposure where, without the dye, it would be quite transparent. Both swing curve and standing waves are reduced by the addition of dye.

However, use of dyed photoresists carries a considerable price: photoresists with all but the very lightest dye loading always exhibit large increases in exposure doses as well as reduced wall angles and final resolution. Both optical and chemical reasons contribute to this deterioration; while the chemical effects (which are due to the changes in the photoresist development parameters caused by the dye addition) may be minimized by judicious choice of the dye's chemical structure, the optical effects (larger Dill B parameter, i.e., increased unbleachable absorption) are inherent in the concept of dye addition, and cannot be avoided. Still, the ease of use of dyed photoresists has made them the most popular solution to reflectivity and swing curve woes.

In the last few years, organic antireflective coatings have entered the market place, and in many cases have proven to be a crucial technology enabling users to safely run processes which previously had low or no latitude. The ease of use of water-soluble antireflective topcoats, which offer only minimal increases in process complexity, has made them a logical choice for users trying to enlarge their process window.

Figure 1:
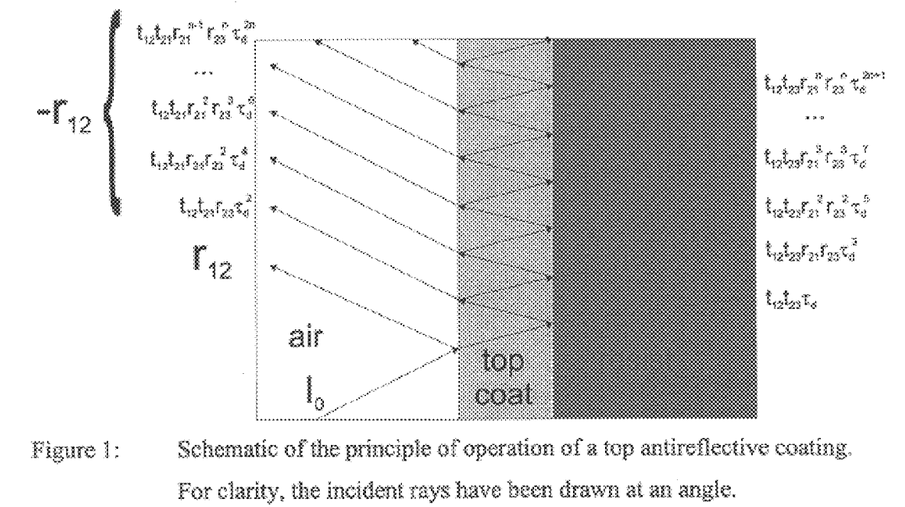
Figure 1: Schematic of the principle of operation of a top antireflective coating. For clarity, the incident rays have been drawn at an angle.

Light falling on a substrate through a thin film undergoes an infinite series of reflections at the boundaries between the thin film and the air as well as at the film/substrate boundary, as shown in FIG. 1. The incoming and outgoing waves interfere in the film, causing constructive interference if their phase difference is an even multiple of p, and destructive interference if their phase difference is an odd multiple of p. Physicists call this film stack a Fabry-Perot etalon, the theory of which is well established. From these considerations, an approximate formula can be derived (cf., e.g., T. Brunner, Proc. SPIE 1466, 297(1991)) which relates the swing curve ratio of a photoresist to the reflectivity $R_t$ at the photoresist-air interface, and the reflectivity $R_b$ at the photoresist/substrate interface:

$$S = 4\sqrt{R_t R_b} \cdot e^{-a_r d}, \tag{1}$$

where d is the photoresist thickness.

Essentially, the idea behind the top antireflective layer is to change the phase of light passed through the layer in such as way that the first and the sum of all subsequent reflection amplitudes in FIG. 1 are out-of-phase by 180 degrees. Incoming and outgoing wave amplitudes interfere destructively, and the swing curve vanishes. Manipulation of the appropriate equations gives two necessary conditions for this phase change:

1. The first and the sum of all subsequent reflection amplitudes are opposite in phase when the film thickness t of the antireflective layer is an odd multiple of $t = \lambda/(4n_t)$, where $n_t$ is the real part of the refractive index of the top layer; and
2. The first and the sum of all subsequent reflection amplitudes are equal in intensity if $n_t = \sqrt{n_r}$, where $n_r$ is the refractive index of the photoresist.

It should be realized that the above equation (1) provides a simple first-order approximation to the swing curve ratio. Employing a more exact treatment, one finds that the swing curve ratio for exposure on a diazonaphthoquinone (DNQ) photoresist will not be zero even if the above conditions are exactly met. Using the Prolith/2 lithography simulator, sold by Finle Technology of Austin, Tex., one finds that for a perfect match it is possible to reduce the swing curve to about 5% of the original value (Example 3). If the simulation data are interpolated linearly, one finds that the predicted remaining swing ratio is less than 1%. In practice, the optimum situation will be somewhat worse since the photoresist changes its absorption and its refractive index during exposure, so that a top layer with an unchanging refractive index cannot be matched to both the beginning and end conditions at the same time. This effect is not taken into account by the Prolith™ simulator.

If one looks for chemical materials to make a top antireflective layer, it turns out that while the first condition, $t=\lambda/(4n_t)$, can be met fairly easily, fulfilling the second one, $n_t=\sqrt{n_r}$, meets with some fairly formidable obstacles. The refractive index of a photoresist at i-line (365 nanometer) is typically about 1.72 to 1.75, which calls for an antireflective coating with a refractive index of $n_t=1.31$ to 1.32. For easier measurement, the literature mostly references the refractive indices at the typical metrology wavelength of 633 nm (nanometers), making the somewhat incorrect assumption that the dispersion behavior of both materials will be identical. In this case, the refractive indices become $n_r=1.64$ and $n_t=1.28$. Unfortunately, it is difficult to find organic materials with refractive indices in the range of 1.28 to 1.31. Known examples include heavily fluorinated, Teflon®-like polymers which require exotic or environmentally unacceptable solvents such as chlorofluorocarbons as spincasting solvents. Moreover, early examples of these layers had to be removed in a second solvent treatment step prior to development.

The TAR concept gained practical importance only with the advent of water-based, developer-soluble antireflective coatings. These coatings, which were originally developed by researchers at IBM Corp. and which have been described in EP 522990, have a dramatically simplified mode of application. They can be spun on from water directly onto the photoresist in two different ways:

1. in a "coat-bake-coat" process in which the photoresist is first coated and prebaked, and the top coating is then spun on top of the dry photoresist; it becomes non-tacky without the need for a second bake step; or 2. in a "coat-coat-bake" process in which the top coating is spun on top of the wet photoresist film, and both are baked together.

For most photoresist materials, it is even possible to use a single spin coater, since the edge bead removal typically can be set up to clean the coater bowl of all top coat residues. For puddle or spray development, no separate step is needed to remove the top coat after exposure; it is fully developer-soluble and will be washed away in the first few seconds of the development process. For very sensitive processes or for immersion development, it is possible to remove the top coat by a short water rinse.

In order to insure water solubility of the top coat, some compromises have to be made with respect to its refractive index. Consequently, water-based topcoats do not achieve the optimum refractive index of 1.28; one commercial material, the AZ® Aquatar coating, available from AZ Electronic Materials, Somerville, N.J., has a refractive index of 1.41. Since over a wide range of refractive indices, the swing curve ratio is an approximately linear function of the absolute value of the difference between refractive indices, this material yields not a 100% but only a 66% reduction in the swing curve. However, for very fine feature sizes and other demanding applications, it is desirable to further reduce the swing curve below the practically achieved 66% reduction. This invention teaches that the use of absorbing top antireflective layers is an approach that makes it possible to achieve this goal with water-based antireflective coatings, and it teaches a practical way to achieve and design such systems.

SUMMARY OF THE INVENTION

Figure 2A:
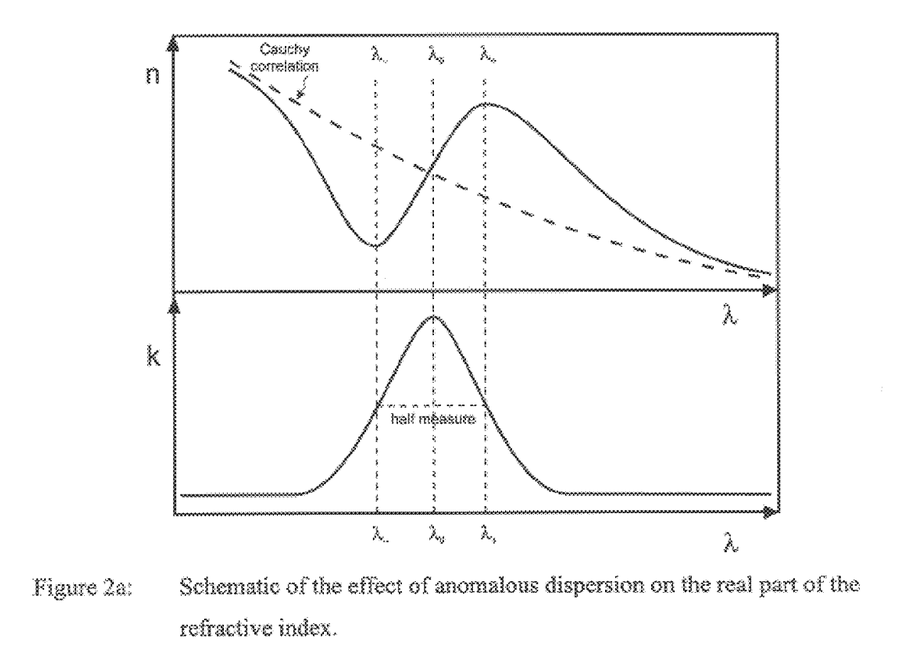
Figure 2a: Schematic of the effect of anomalous dispersion on the real part of the refractive index.
Figure 2B:
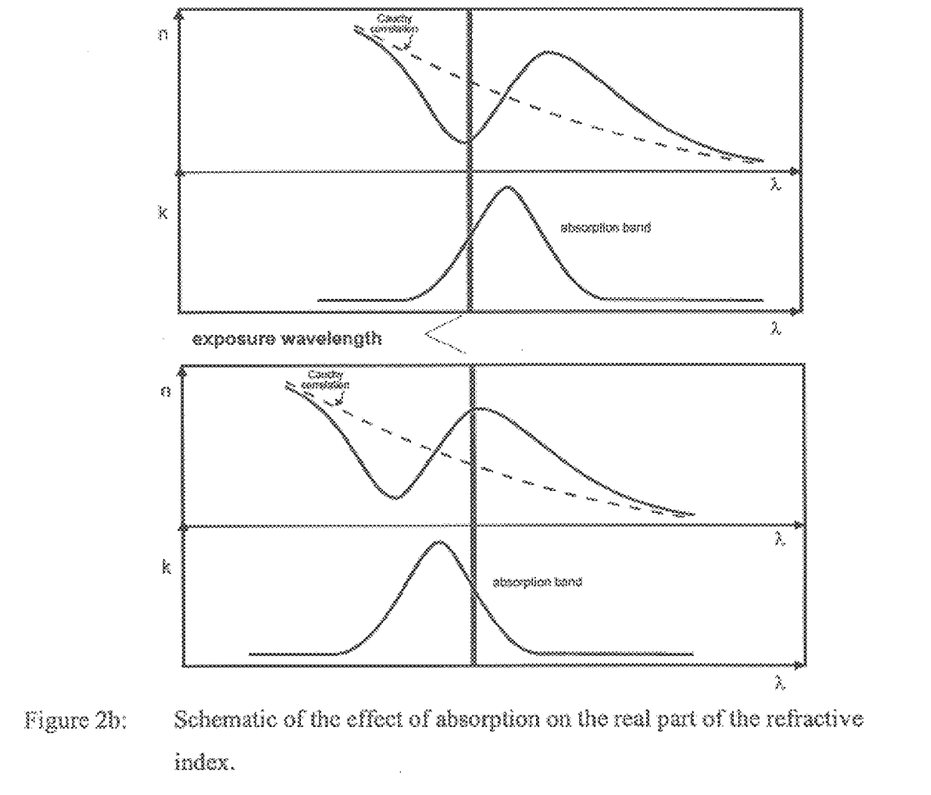
Figure 2b: Schematic of the effect of absorption on the real part of the refractive index.
Figure 2C:
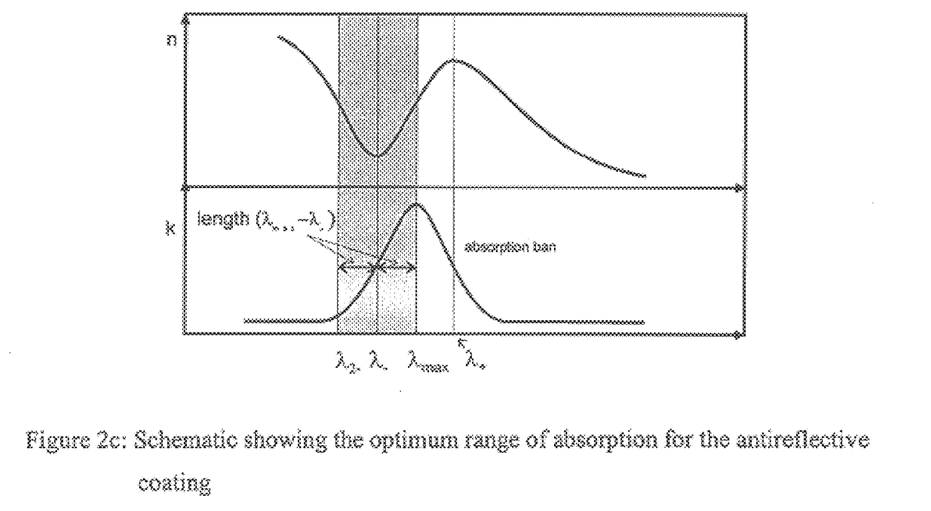
Figure 2c: Schematic showing the optimum range of absorption for the antireflective coating

The invention teaches a light absorbing top antireflective layer which reduces the swing curve amplitude for photoresist materials used in the semiconductor industry, and of processes for its use. The light absorbing top antireflective layer comprises a light absorbing, non-photobleachable compound which is chosen such that the wavelength of maximum absorption ($\lambda_{max}$) is higher than the exposure wavelength, and further where the exposure wavelength is in the region defined by $\lambda_{max}$ and $\lambda_{2-}$ (region of minimum absorption), which results in a reduction in the real part of the refractive index of the antireflective coating at the exposure wavelength, as shown in FIGS. 2a, 2b and 2c. Preferably, the wavelength of absorption of the light absorbing compound is chosen such that the wavelength of maximum absorption is higher than the exposure wavelength, and further where the exposure wavelength is at about $\lambda$ (wavelength at half height, as shown in FIG. 2a). The coating may be water based but is not necessarily so. The advantage of a water-based coating is its ease of use, since it can be applied without intermixing with the soft baked photoresist, and is removed in the development step, so that process complexity is only minimally increased.

DESCRIPTION OF THE INVENTION

In the following, we will be writing the refractive index as a complex number N=n−ik, where n is the real part of N, and is equivalent to what is commonly called "the refractive index". k, the imaginary part of N, is related to the absorption coefficient as a function of wavelength, $\alpha(\lambda)$, by $k=\alpha\lambda/(4\pi)$. In the above we have followed the "optical" (vs. the "physical") convention for the sign of k.

Two effects combine to make the use of absorbing top antireflective layers particularly practical and advantageous: anomalous dispersion and non-reflective index intensity matching.

In regions of high absorbency, the real part of the refractive index shows what is known as anomalous dispersion. A schematic of anomalous dispersion is shown in FIG. 2. As can be seen, in the wavelength region below the absorbency maximum, the refractive index shows a decrease the size of which is correlated to the strength of the absorption.

The relation between the real and the imaginary part of the refractive index $k_b=\alpha\lambda/(4\pi)$ is given via the dielectric constant $\epsilon=\epsilon'-\epsilon''=\tilde{n}^2=n^2-k^2-2i\,n\,k$ by a special Hilbert transform called a Kramers-Kronig relation:

$$\varepsilon'(\omega) - 1 = \frac{2}{\pi} P \int_0^\infty d\omega' \frac{\varepsilon''(\omega')\omega'}{\omega'^2 - \omega^2} \quad (2)$$

$$\varepsilon''(\omega) = -\frac{2\omega}{\pi} P \int_0^\infty d\omega' \frac{\varepsilon'(\omega') - 1}{\omega'^2 - \omega^2}$$

where $\omega=c/(2\pi\lambda)$, and where P denotes that the principal part of the integral is to be taken.

It is a fundamental property of absorbing materials that the refractive index is changed at the wavelengths that absorption takes place. This behavior, which is called anomalous dispersion, is shown graphically in FIG. 2a of the pending application. It is usually found that for reasonably symmetrical absorption bands, that at the absorption maximum, the anomalous dispersion contribution is approximately zero, that the local maximum in n occurs just before the half height of the absorption band on the long wavelength side, and that the local minimum in n occurs just after the half height on the low wavelength side. These positions have been indicated as $\lambda_{max}$, $\lambda_+$ and $\lambda_-$ in FIG. 2a. On the long wavelength side of an absorption band, the refractive index is higher than on the short wavelength side, with the amplitude of the refractive index "wriggle" being determined by the strength of the absorption. This behavior of the real part of the refractive index is a direct consequence of equation (2). In particular, it is found that the minimum of the refractive index is situated at or at least close to the half-height of the absorption band on the short wavelength side.

Since it is generally the case for most organic films that the refractive index of the antireflective coating must be lowered for minimum reflection, it is therefore advantageous to choose the dye in such a way that its absorption band puts the local minimum in n as close as possible to the position of the lithographic exposure wavelength of interest, i.e., for best effect the dye must be selected in such a way that the half-height point of the top antireflective film's absorption on the low wavelength side must lie at or close to the target lithographic exposure wavelength.

FIG. 2b illustrates this principle: in the top part of the FIG. 2b, the dye has been chosen judiciously, and the position of its absorption band is such that a substantial reduction of the real part n of the refractive index is achieved; in the bottom part of FIG. 2b, an injudicious choice is shown as a counterexample in which the absorption of the dye is positioned such that the real part of the refractive index is raised. It is seen from this illustration that although the two depicted dyes have approximately equal absorbency, their impact on the real part of the refractive index is quite different. In the former case, the dye raises the real part of the refractive index, leading to a poorer performing antireflective coating. In the latter case, the dye decreases the refractive index of the antireflective coating, leading to a better performing antireflective material: thus absorption is chosen such as to cause a reduction in the real part of the refractive index of the antireflective coating at the irradiation wavelength. Since, as stated before, organic materials typically have refractive indices which are too high to achieve index of the antireflective coating at the irradiation wavelength. Since, as stated before, organic materials typically have refractive indices which are too high to achieve effective antireflection, it is clear that the characteristic of dye in the upper example of FIG. 2b is better suited for use in an antireflective layer than the one in the lower part of FIG. 2b.

In practice it may prove difficult to formulate a top antireflective film in which the refractive index minimum is located exactly at the lithographic exposure wavelength. However, it is not necessary to achieve an exact match. Any dye with an absorption maximum ($\lambda_{max}$) at a higher wavelength than the lithographic exposure wavelength ($\lambda_E$) will benefit from the effects of anomalous dispersion; of course, if the absorption wavelength is too far away, the benefit may be too small to be of practical importance. The effects of anomalous dispersion are strongest, in the region between $\lambda_{max}$ and $\lambda_{2-}$ (minimum absorption) as illustrated in FIG. 2c. Thus, the dyed antireflective coating of this invention should have its maximum absorption wavelength at a higher wavelength than the exposure wavelength and also lie within the region defined by $\lambda_{max}$ and $\lambda_{2-}$, that is, $\lambda_E < \lambda_{max}$ and $\lambda_{2-} \leq \lambda_E < \lambda_{max}$. Preferably the exposure wavelength of the dyed antireflective coating of this invention should have its maximum absorption wavelength higher than the exposure wavelength and also be at about $\lambda_{31}$, that is, $\lambda_E < \lambda_{max}$ and $\lambda_E \approx \lambda_-$.

By such a judicious choice of the right dye, it is thus possible to select out of all possible dyes those which, in the environment of the top antireflective layer, exhibit an absorption maximum and half width of the absorption band of such a kind that the real part of the refractive index is strongly depressed at a target exposure wavelength ranging from about 100 nm to about 600 nm, e.g., the lithographically important mercury i- or g-line bands at 365 and 435 nm, or the KrF and ArF excimer laser wavelengths at 248 and 193 nm. It is stressed that the important criterion is the absorption of the dye in the antireflective layer as it is used for lithography, not the absorption of the dye in pure form or in a liquid solution. This distinction is necessary since in the antireflective layer, the presence of additives, film formners (if the dye is not in itself film forming) or other compounds can lead to substantial shifts in the position and shape of the dye's absorption band. It is thus not only the absorption behavior of the isolated or pure dye In principle, nearly any value of the real part of the refractive index can be reached by using anomalous dispersion: it may be raised above 40 or even lowered below the value of 1 for extremely absorbing substances (e.g., for cadmium sulfide around 250 cm$^{-1}$). In practice, for organic dyes in the region of interest (450–180 nm), it is difficult to reach absorption values above $\alpha=20$ $\mu$m$^{-1}$, or k values above 0.6 to 0.7. If the additional constraint is added that the material must be film forming, typically only about a maximum of 60–70% of the material's mass will consist of an active dye, whether polymerically bound or in the form of an admixture of a dye to a film forming material. This means that for practical purposes, typical a values will be limited to a maximum of 12 to 14 $\mu$m$^{-1}$.

For example, a commercial antireflective bottom layer, AZ®BARLi™ coating, available from AZ Electronic Materials, Somerville, N.J., which is the film-forming organic material the most strongly absorbing in the near-UV region known to the inventors, has an absorption of $\alpha=11.5$ $\mu$m$^{-1}$ at 365 nn, corresponding to a k value of 0.334. A measurement of the dispersion curve of this material by spectroscopic ellipsometry showed that the total change of the real part of the refractive index n($\lambda_+$)-n($\lambda_-$) was about 0.32. Although AZ®BARLi™ coating is solvent-based and not water soluble, this demonstrated that a refractive index reduction of about $\Delta n=0.16$ can be achieved with organic film forming materials. With many organic materials available which have refractive indices of 1.45 and below, it is thus feasible to reduce the real part of the refractive index to the optimum range for maximum swing curve reduction by adding absorption to the film and utilizing anomalous dispersion. This strategy is aided by the fact, as will be shown below, that the optimum refractive index range for absorbing top coats is higher for absorbing materials than for non-absorbing materials.

In absorbing top antireflective layers, the match of the absolute values of the amplitudes of the first reflection and the sum of all rays being refracted out of the top layer (cf. FIG. 1) is partially provided by the attenuation of the ray in the absorbing medium. Some light is now lost to absorption and the above sum must now be smaller than before in order to still meet the intensity match criterion. It follows that the optimum refractive index of an absorbing top layer must be higher than that of a non-absorbing one, and that the higher the absorption of the top layer, the higher the refractive index of the top layer must become in order to compensate. This phenomenon has been referred to above as "non-reflective intensity matching".

A Japanese patent application (Japanese Patent Office Public Disclosure Bulletin No. 7-153682, to Sony Co., dated Jun. 16, 1995; henceforth called the "Sony application") describes a lithographic process which makes use of dyed antireflective coatings for DUV lithography applications (180–300 nm (nanometer)). The Sony application describes the effects of attenuation of the beam in the dyed layers based on modeling of the reflectivities of the antireflector/photoresist film stack. It does not teach the use of anomalous dispersion to reach optimal or near optimal refractive indices of the top antireflective layer.

It remains to be shown what the optimum conditions are for such a light-absorbing top antireflective layer. For absorbing media, the formulae from which optimality conditions such as the ones given in Equation 2 for non-absorbing top layers can be derived can become rather complex. It is therefore easier to use a numerical simulator such as Prolith/2 to calculate the optimum film properties (thickness, absorption, and refractive index) for maximum swing curve reduction. Example 4 provides such an analysis.

Figure 8:
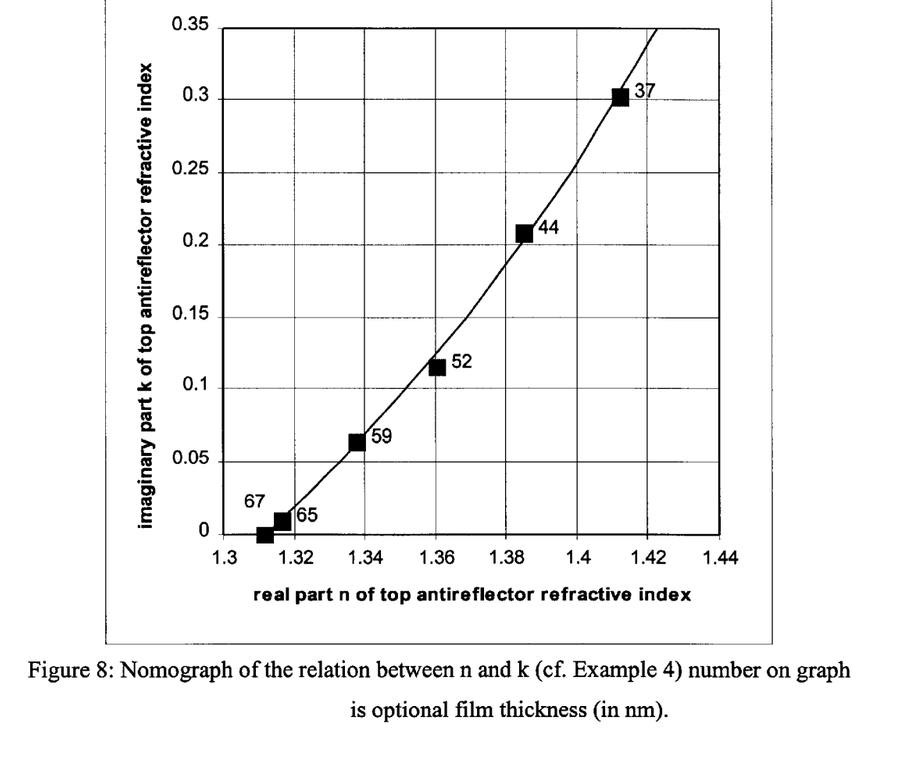
Figure 8: Nomograph of the relation between n and k (cf. Example 4) number on graph is optional film thickness (in nm).

As can be seen from Example 4, the optimum refractive index indeed increases with the absorption of the top antireflective layer, as predicted above based on qualitative arguments. Table 3 and FIG. 8 provide quantitative insight into the relationship between real and imaginary parts of the refractive index and the top layer thickness.

Practical Implementation of Light-Absorbing Antireflective Top Layers

The use of dyed top antireflective coatings, which utilize anomalous dispersion to achieve an improved match between the photoresist and the optical properties of the top antireflective coating, is not limited to any particular casting solvent. While water is preferred as a casting solvent due to ease of use and environmental friendliness, it is also possible to utilize solvent-based antireflective topcoats. The solid components of the antireflective coating may be fully or partially soluble in the solvent, providing acceptable film may be formed. The solvent for these materials may then either be chosen in such a way that no intermixing occurs with the photoresist, or one may counteract intermixing problems by a transparent barrier layer, preferably of thickness $\lambda/(2n)$, which makes the layer optically neutral. Typically, such a solvent-cast antireflective top layer would be removed in a solvent rinse step prior to development. To reduce the process complexity involved with this, one might consider to design the top layer in such a way that it is cast from a solvent, but soluble in the developer.

For the purposes of optics, a top antireflecting film is completely characterized by its complex index of refraction and thickness (provided that the film is homogeneous). Therefore, the chemical vehicle by which the absorption is introduced into the antireflective layer is of no consequence: whether a dye is introduced as a polymeric material which is in itself film-forming, or whether the absorption is caused by a monomeric dye added to a polymeric film former, the swing curve reducing action is the same if the optical constants are the same. Example 1 describes a top antireflective layer consisting of an aqueous solution of a polyacrylic acid film former, a perfluorinated surfactant of low refractive index, and a water-soluble dye (FD&C Yellow #5). The relative ratios of the components have been chosen to form a film with $\alpha=4$ $\mu m^{-1}$. The dispersion curve of the film as obtained by spectroscopic ellipsometry (FIG. 3) shows that for i-line exposure, the film's refractive index has been closely matched to the optimum value by the use of the anomalous dispersion effect. The value of n=1.339 at 366 nm is actually lower than the optimum value found in Example 3 as the optimum refractive index for a top antireflecting coating of that absorbency. An optimum match can be achieved by lowering the amount of dye added to the solution.

While Example 1 shows that anomalous dispersion effects may be utilized to achieve optimum optical constants, Example 3 demonstrates the beneficial effects of dyed top antireflecting coating. The methods used are tested and validated in Example 2 against the well-known case of a transparent top antireflecting coating. Finally, Example 4 defines the optimum conditions for dyed top antireflective coatings as sets of {n, k, t} values.

The antireflective coating composition is coated on top of the photoresist coating using techniques well known to those skilled in the art, such as dipping, spincoating or spraying. The film thickness of the antireflective coating ranges from about 0.1 $\mu m$ (micrometer) to about 1 $\mu m$ (micrometer). The coating is further heated on a hot plate or convection oven to remove any residual solvent if desired.

Photoresists can be any of the types used in the semiconductor industry provided the sensitivity of the photoactive compound in the photoresist matches that of the antireflective coating.

There are two types of photoresist compositions, negative-working and positive-working. When negative-working photoresist compositions are exposed image-wise to radiation, the areas of the photoresist composition exposed to the radiation become less soluble to a developer solution (e.g. a cross-linking reaction occurs) while the unexposed areas of the photoresist coating remain relatively soluble to such a solution. Thus, treatment of an exposed negative-working photoresist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working photoresists because the former generally have better resolution capabilities and pattern transfer characteristics. Photoresist resolution is defined as the smallest feature which the photoresist composition can transfer from the photomask to the substrate with a high degree of image edge acuity after exposure and development. In many manufacturing applications today, photoresist resolution on the order of less than one micron are necessary. In addition, it is almost always desirable that the developed photoresist wall profiles be near vertical relative to the substrate. Such demarcations between developed and undeveloped areas of the photoresist coating translate into accurate pattern transfer of the mask image onto the substrate. This becomes even more critical as the push toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of photoresists typically ranges from about 350 nm to 440 nm.

Photoresists sensitive to short wavelengths, between about 180 nm and about 350 nm can also be used. These photoresists, sensitive around 248 nm, normally comprise polyhydroxystyrene or substituted polyhydroxystyrene derivatives, a photoactive compound, and optionally a solubility inhibitor. The following references exemplify the types of photoresists used and are incorporated herein by reference, U.S. Pat. No. 4,491,628, U.S. Pat. No. 5,069,997 and U.S. 5,350,660. Similarly, photoresists sensitive around 193 nm, can also be used.

A film of photoresist is coated on top of the substrate and, optionally, baked to substantially remove the photoresist solvent. The dyed top antireflective coating is then coated on top of the photoresist and baked, if necessary, to remove any solvents. The photoresist is imagewise exposed and developed in an aqueous alkaline developer, such as tetramethyl ammonium hydroxide, to remove the treated photoresist and the top coat. An optional heating step can be incorporated into the process prior to development and after exposure. The process of coating and imaging photoresists is well known to those skilled in the art and is optimized for the specific type of photoresist used. The patterned substrate can then be dry etched in a suitable etch chamber to remove the exposed portions of the antireflective film, with the remaining photoresist acting as an etch mask.

The following specific examples will provide a detailed illustration of using the present invention. These examples are not intended, however, to limit or restrict the scope of the invention in any way and should not be construed as providing conditions, parameters or values which must be utilized exclusively in order to practice the present invention.

EXAMPLE 1

Figure 3:
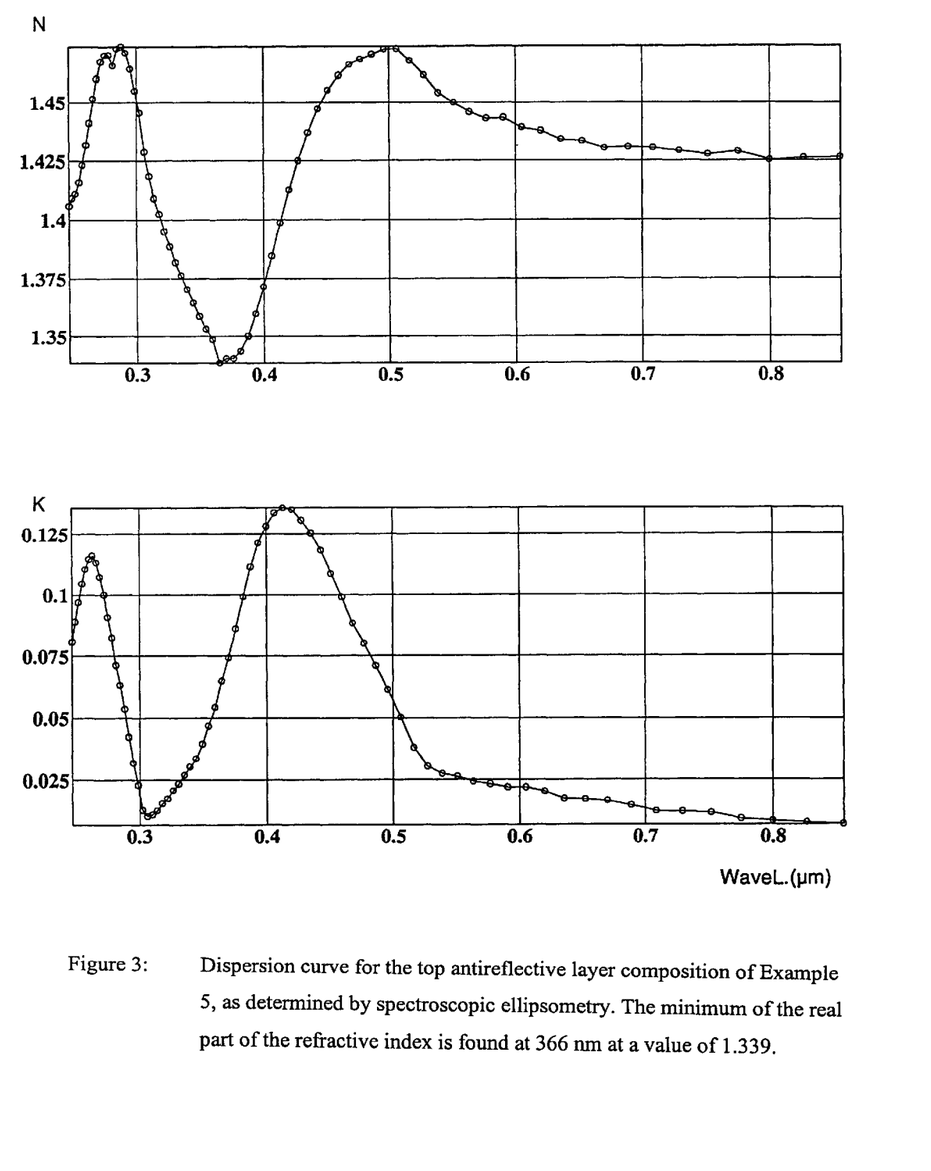
Figure 3: Dispersion curve for the top antireflective layer composition of Example 5, as determined by spectroscopic ellipsometry. The minimum of the real part of the refractive index is found at 366 nm at a value of 1.339.

Use of Anomalous Dispersion to Lower the Refractive Index of a Top Antireflective Layer The commercial antireflective AZ® Aquatar coating was mixed with a commercial solution of a yellow dye in a weight ratio of 2.5 to 1.5. The dye used was McCormick Food Yellow, the major active component of which is FD&C Yellow No. 5, also known as tartrazine. McCormick Food Yellow contains a small part of Allura Red food dye as well as non-dyed ingredients such as ethylene glycol. The resulting mixture was spun on a silicon wafer to yield an approx. 300 nm (nanometers) coating. After storage overnight, the real and imaginary part of the refractive index as well as the thickness were determined by spectroscopic ellipsometry on a SOPRA ES4G spectroscopic ellipsometer. The thickness was first determined by fitting a Cauchy model to the long wavelength part of the dispersion curve, where k was known to be zero from UV spectroscopic measurements. With the known thickness, the dispersion curves for n and k were then measured for the entire spectral range from 700 to 220 nm (nanometers) (FIG. 3). It was found that the dispersion curve for n shows the kind of dip depicted in FIG. 2, and that the minimum occurs at a wavelength of 366 mn (nanometers) with a value of n=1.339. The maximum in the k dispersion curve occurred at 412 nm (nanometers) with a value of k=0.136. The refractive index of the AZ® Aquatar coating at this wavelength was determined by mode coupling experiments to be approx. 1.42. The refractive index has thus been lowered by a value of 0.08 by the addition of the dye.

Example 2

Prolith/2 Calculations of the Swing Curve Ratio for a Non-absorbing Top Antireflector ($\alpha=0\ \mu m^{-1}$) (Comparative Example)

The swing curve reduction for a non-dyed antireflector in -line exposure was calculated by the PROLITH/2 lithography simulator program. The AZ7500, available from AZ Electronic Materials, Somerville, N.J., parameter set contained in the program (Version 4.05) was used with the change that the photoresist refractive index was set to 1.7161 for 365 nm (nanometers). The antireflector was made non-absorbing by setting its A and B parameters to zero. Swing curves (open point dose vs. photoresist thickness) were calculated for antireflector film thicknesses between 0.040 and 0.080 $\mu$m (micrometers) using the program's nested multiple run feature. The data were saved in ASCII files and imported into the Microsoft Excel spreadsheet program. Using a non-linear least squares fit through the program's SOLVER function, swing curves were fitted to the equation $$E = a \cdot \cos\left(\frac{4\pi}{\lambda} n_r t + c\right) + d * t + e,$$

where a,c,d and e are the fit parameters, and t is the photoresist film thickness. The fit was carried out without constraints but the swing amplitude was always assured to be positive by choice of appropriate phase parameters c as starting conditions. The obtained "a" parameters were then divided by the "a" parameter of the swing curve of the photoresist without a top antireflector. The results of this analysis are listed in Table I.

TABLE 1

Relative swing curve ratios (vs. the photoresist without top antireflector layer) as a function of the top antireflector's film thickness and refractive index for a non-absorbing top layer. All numbers in %. For details of calculation, see text.

| | refract. index | | | | | | | | | | |
|---|---|---|---|---|---|---|---|---|---|---|---|
| t [$\mu$m] | 1.26 | 1.28 | 1.3 | 1.31 | 1.32 | 1.34 | 1.36 | 1.38 | 1.4 | 1.41 | 1.42 |
| 0.04 | 61.65 | 59.78 | 57.95 | 57.79 | 56.83 | 55.99 | 55.15 | 55.63 | 55 | 55.2 | 55.48 |
| 0.045 | 53.16 | 50.6 | 49.17 | 48.16 | 47.39 | 46.61 | 46 | 45.87 | 46.49 | 46.91 | 47.66 |
| 0.05 | 43.99 | 41.69 | 39.24 | 38.32 | 37.71 | 36.41 | 36.61 | 36.76 | 38.09 | 38.25 | 39.57 |
| 0.055 | 34.73 | 32.02 | 29.01 | 28.08 | 27.31 | 26.87 | 27.01 | 28.21 | 30.14 | 31.49 | 33.46 |
| 0.06 | 26.06 | 22.27 | 18.63 | 18.11 | 16.88 | 16.88 | 18.59 | 21.26 | 24.54 | 26.4 | 29.08 |
| 0.065 | 17.99 | 13.23 | 8.6 | 7.65 | 7.04 | 9.08 | 13.32 | 18.81 | 23.9 | 26.65 | 29.13 |
| 0.07 | 13.51 | 7.86 | 2.73 | 3.52 | 5.66 | 10.99 | 16.61 | 21.99 | 28.05 | 30.29 | 32.96 |
| 0.075 | 15.68 | 12.89 | 13.45 | 14.46 | 16.16 | 20.34 | 25.18 | 29.85 | 35.19 | 38.01 | 40.6 |
| 0.08 | 22.73 | 22.22 | 23.95 | 25.41 | 26.84 | 30.35 | 34.93 | 39.3 | 43.97 | 46.26 | 48.84 |

Figure 4:
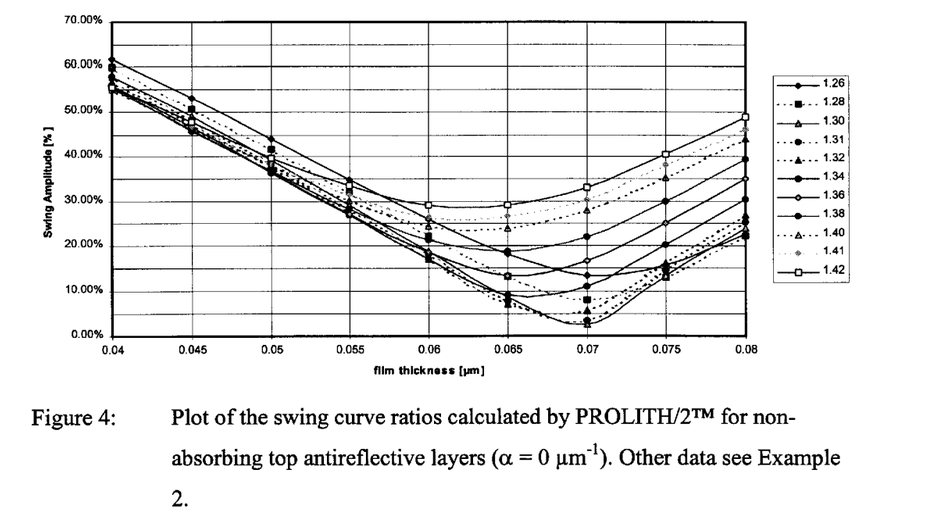
Figure 4: Plot of the swing curve ratios calculated by PROLITH/2™ for non-absorbing top antireflective layers ($\alpha = 0\ \mu m^{-1}$). Other data see Example 2.
Figure 5:
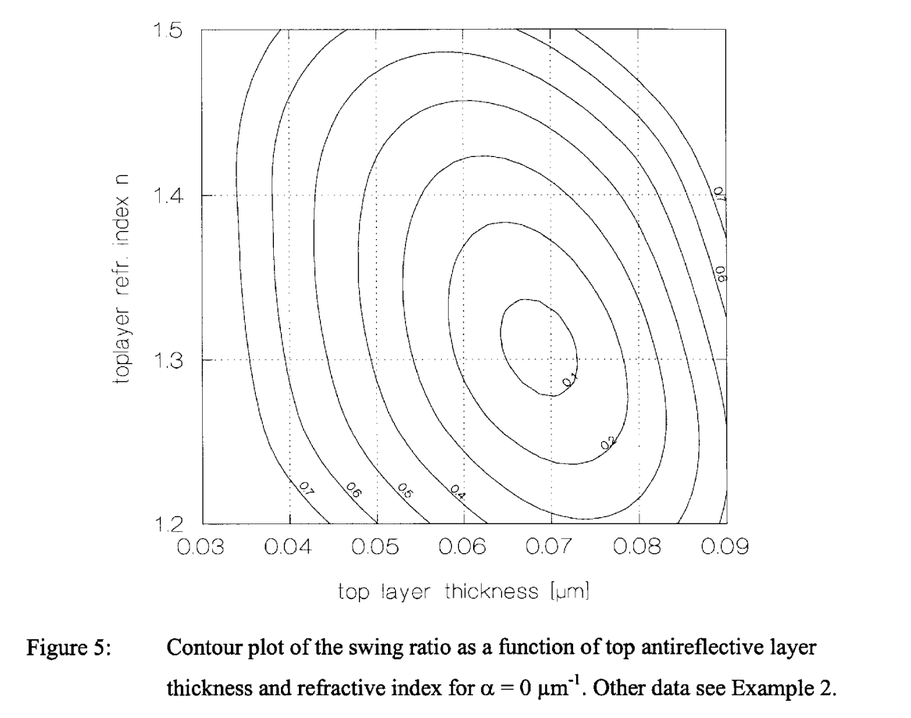
Figure 5: Contour plot of the swing ratio as a function of top antireflective layer thickness and refractive index for $\alpha = 0\ \mu m^{-1}$. Other data see Example 2.

It is seen that the minimum of the swing curve ratio is obtained for a refractive index between 1.30 and 1.31 at a film thickness of 0.07 $\mu$m (micrometers), in good accordance with the prediction of the antireflector model described in the Background section. A linear extrapolation of the two branches of the swing curve vs. antireflector film thickness plot (cf. FIG. 4) yields an intersection point of 0.6% at a film thickness of 0.0687 $\mu$m (micrometers). A contour plot of the swing ratio as a function of TAR thickness and refractive index for the case I=0 is provided in FIG. 5.

By comparison, at the refractive index of the AZ® Aquatar coating (n=1.42 at 365 nm), one observes a swing curve ratio of 29% for an optimum film thickness of approximately 0.063 $\mu$m (micrometers).

Example 3

Prolith/2 Calculations of the Swing Curve Ratio for a Dyed Top Antireflector with Absorptivity $\alpha=4$ $\mu m^{-1}$ The calculations of Example 2 were repeated with the difference that the B parameter of the top antireflective layer was set to a value of 4.0 $\mu m^{-1}$ in order to make the top layer absorbing. This B parameter corresponds to a k value of 0.116. The results are tabulated in Table 2 below.

Figure 6:
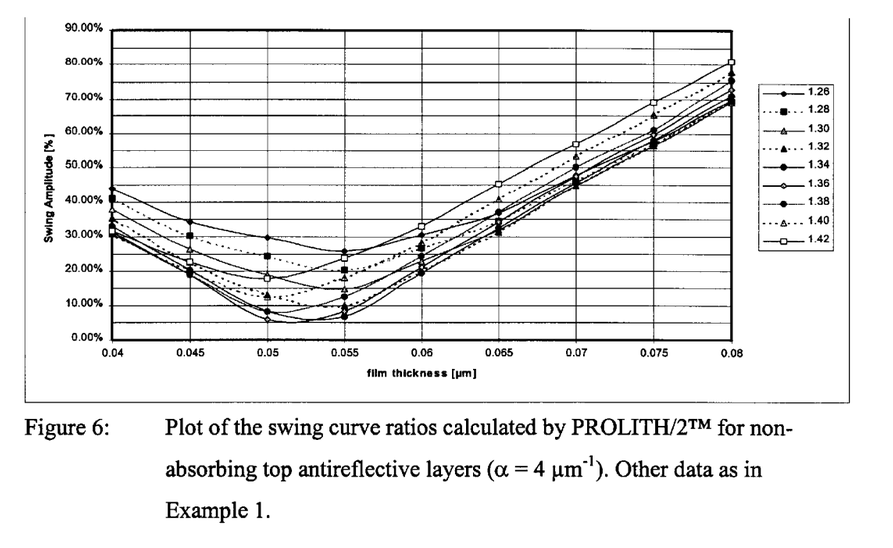
Figure 6: Plot of the swing curve ratios calculated by PROLITH/2™ for non-absorbing top antireflective layers ($\alpha = 4\ \mu m^{-1}$). Other data as in Example 1.
Figure 7:
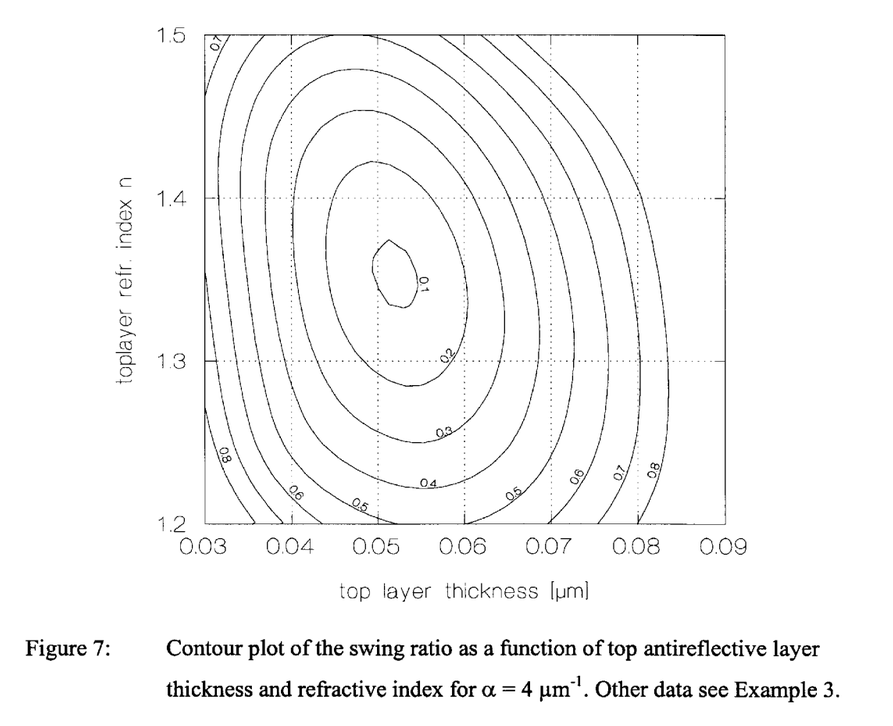
Figure 7: Contour plot of the swing ratio as a function of top antireflective layer thickness and refractive index for $\alpha = 4\ \mu m^{-1}$. Other data see Example 3.

It is seen by inspection of Table 2 that the minimum has moved to a higher refractive index and is now found between n=1.36. At the same time, the optimum top layer thickness has decreased to between 0.050 and 0.055 µm (micrometers). A linear extrapolation of the two branches of the swing curve vs. antireflector film thickness plot (cf. FIG. 6) yields an intersection point of 0.7% at a film thickness of 0.0520 µm (micrometers). A contour plot of the swing ratio as a function of TAR thickness and refractive index for the case I—4 is provided in FIG. 7.

TABLE 2

Relative Swing Curve Ratios (Vs. The Photoresist Without Top Antireflector Layer) As A Function Of The Top Antireflector's Film Thickness And Refractive Index For A Top Layer With K = 0.116. All numbers in %. For details of calculation, see text.

| d | refract. index | | | | | | | | |
|---|---|---|---|---|---|---|---|---|---|
| [µm] | 1.26 | 1.28 | 1.30 | 1.32 | 1.34 | 1.36 | 1.38 | 1.40 | 1.42 |
| 0.04 | 43.89 | 40.90 | 37.92 | 35.26 | 33.14 | 31.51 | 30.71 | 30.73 | 31.82 |
| 0.045 | 34.31 | 30.31 | 26.31 | 22.74 | 20.29 | 19.00 | 18.91 | 20.21 | 22.73 |
| 0.05 | 29.67 | 24.26 | 18.84 | 13.10 | 8.25 | 5.87 | 8.23 | 12.58 | 17.91 |
| 0.055 | 25.78 | 20.28 | 14.77 | 9.82 | 6.85 | 8.31 | 12.42 | 18.03 | 23.65 |
| 0.06 | 30.66 | 26.72 | 22.78 | 20.20 | 19.44 | 21.09 | 24.27 | 28.19 | 32.99 |
| 0.065 | 36.86 | 34.48 | 32.11 | 31.41 | 32.47 | 34.36 | 37.04 | 40.67 | 45.23 |
| 0.07 | 47.92 | 46.33 | 44.73 | 44.69 | 45.53 | 47.41 | 50.08 | 53.15 | 56.98 |
| 0.075 | 57.73 | 56.98 | 56.22 | 56.39 | 58.00 | 59.73 | 61.26 | 65.50 | 68.99 |
| 0.08 | 69.62 | 69.34 | 69.06 | 69.74 | 71.10 | 73.04 | 75.50 | 77.76 | 80.99 |

These results indicate that the swing curve reduction by a optimal dyed top antireflector is comparable to that of an optimal non-dyed one. The optimal dyed antireflector offers the additional advantage that the optimum operating point is located at a higher refractive index. It offers the disadvantage that the required dose is increased: relative to the undyed top antireflector, as a result of loss of light by absorption in the top layer. If the required dose-to-clear for the first swing curve max. after 0.8 µm (micrometers) for AZ®7500 photoresist with no top antireflector=is set as 100%, the dose-to-clear with the undyed top layer is calculated to about 70%, and that of the dyed antireflector with a=4 µm$^{-1}$ is calculated to be 97%, where both of the latter are for the optimal optical properties of the top antireflectors determined in Examples 2 and 3.

EXAMPLE 4

Relationship Between n,k and t for Optimum Swing Curve Reduction

Using the techniques described in Example 2 and 3, a series of calculations were carried out for various values of the top layer refractive index components $n_T$ and $k_T$ as well as the top antireflector film thickness t in order to determine the relation between them. Using a sample of 7 points, it was found that near-zero swing curve ratios could be obtained if $n_T$ and t as well as $k_T$ and t were related by the regressions $t = -0.3034\, n_T + 0.4647$, $r^2 = 0.9993$ $t = 0.0666\, \exp(-1.973\, k_T)$, $r^2 = 0.9984$, which when combined yield the relation $n_T = 1.5316 - 0.2195\, \exp(-2\, k_T)$, where the exponent 1.973 has been replaced with 2. FIG. 8 shows the excellent quality of this fit of $n_T$ vs. k7, in a nomograph (data see Table 3).

TABLE 3

Optimum Refractive Index, Film Thickness, For Various Top Layer Absorptivities. Results are for Prolith/2 calculations at 365 nm exposure wavelength[1].

| α [µm$^{-1}$] | k | n | t [µm] (from k) | t [µm] (from n) | t average[2] [µm] |
|---|---|---|---|---|---|
| 0 | 0.000 | 1.320 | 0.067 | 0.064 | 0.065 |
| 2 | 0.058 | 1.352 | 0.059 | 0.054 | 0.057 |
| 4 | 0.116 | 1.372 | 0.053 | 0.048 | 0.051 |
| 6 | 0.174 | 1.389 | 0.047 | 0.043 | 0.045 |
| 8 | 0.232 | 1.405 | 0.042 | 0.038 | 0.040 |
| 10 | 0.290 | 1.419 | 0.037 | 0.034 | 0.036 |
| 12 | 0.349 | 1.431 | 0.033 | 0.030 | 0.032 |

[1]. see Example 3 for simulation parameters
[2]. av. value may deviate from average of tabulated values since more digits are used for calculation.

EXAMPLE 5

Practical Verification of Theoretical Prediction

Figure 9:
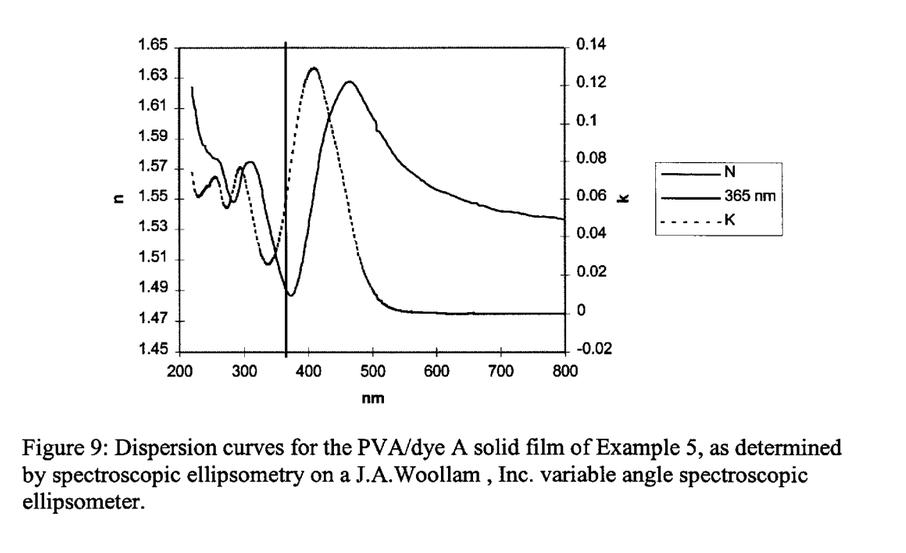
Figure 9: Dispersion curves for the PVA/dye A solid film of Example 5, as determined by spectroscopic ellipsometry on a J.A.Woollam, Inc. variable angle spectroscopic ellipsometer.

A solution of a dye product obtained from Milliken Chemical, Spartanburg, S.C. (DYE A, 90 parts w/w) was prepared with a 10 parts w/w of a polyvinyl alcohol binder, MW ca. 8–9,000, as an aqueous solution to yield a film of 520 Å thickness with optical constants at 365 nm of n=1.4905 and k=0.05595, corresponding to an absorption of I=1.926 µm$^{-1}$, as determined by spectroscopic ellipsometry using a J. A. Woollam, Inc. variable angle spectroscopic ellipsometer. The position of the minimum is nearly perfectly matched with the 365 nm (nanometers) exposure wavelength (cf. FIG. 9) but the absorptivity of the dye is not sufficient to quite come into the optimum range as defined by Example 4. This formulation is therefore not expected to fully suppress the swing curve.

For a film with the thickness and optical constants given above, the Prolith™ lithography simulator predicts a reduction of the dose-to-clear swing ratio of AZ®7800 photoresist, a commercial product of AZ Electronic Materials, Somerville, N.J., to about 46% of the value observed in the absence of the antireflector film. An experimental dose-to-clear swing curve obtained on a Nikon i-line stepper (development in 2.38% TMAH solution) showed a reduction of the swing amplitude to 55% (from ±18 mJ/cm$^2$ to ±10 mJ/cm$^2$). The difference maybe due to low coating uniformity of the antireflector film which may be a consequence of the very high dye concentration.

What is claimed is:

1. A process for forming an image comprising:
   a) forming a photoresist film on a substrate;
   b) providing an antireflective coating solution comprising:
      (i) choosing a light absorbing compound having a wavelength of maximum absorption higher than an exposure wavelength used to expose the photoresist, and, furthermore, where the exposure wavelength is within the region of the light absorbing compound defined by $\lambda_{max}$ and $\lambda_{2-}$,
      (ii) forming an antireflective coating solution comprising the light absorbing compound and a solvent;
   c) forming a coating of the antireflective coating solution on the photoresist film;
   d) imagewise exposing the photoresist film coated with the antireflective coating solution;
   e) developing to form an image; and, f) optionally baking the substrate before or after the developing step.

2. The process of claim 1, wherein the antireflective coating is removed during the developing step.

3. The process of claim 1, wherein the antireflective coating is removed by a water rinse prior to a post exposure bake treatment.

4. The process of claim 1, wherein the antireflective coating is separated from the photoresist by one or more barrier layers.

5. The process of claim 4, wherein the barrier layers are transparent and are refractive index-matched to the photoresist.

6. The process of claim 4, wherein the barrier layers are of a thickness that makes the barrier layers optically neutral.

7. The process of claim 4, wherein the antireflective layer is removed from the barrier layer by a solvent rinse.

8. The process according to claim 1, where the exposure wavelength ranges from about 100 nm to about 600 nm.

9. The process according to claim 1, where the solvent of the antireflective coating solution is water.

10. The process according to claim 1, where the antireflective coating of step c) is soluble in water.

11. The process according to claim 1, where the antireflective coating is soluble in an aqueous alkaline solution.

12. The process according to claim 1, where the light absorbing compound is selected from the group consisting of a polymeric dye, a monomeric dye and a mixture thereof.

13. The process according to claim 1, where the antireflective coating solution further comprises nonabsorbing additives.

14. The process according to claim 13, where the nonabsorbing additive is a polymer.

* * * * *